(12) United States Patent
Jeong et al.

(10) Patent No.: US 7,632,947 B2
(45) Date of Patent: Dec. 15, 2009

(54) PYRIMIDOPYRIMIDINE DERIVATIVES, ORGANIC THIN FILM TRANSISTORS USING PYRIMIDOPYRIMIDINE DERIVATIVES AND METHOD FOR FABRICATING THE SAME

(75) Inventors: Eun Jeong Jeong, Seongnam-Si (KR); Sang Yoon Lee, Seoul (KR); Bang Lin Lee, Suwon-Si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 98 days.

(21) Appl. No.: 11/358,050

(22) Filed: Feb. 22, 2006

(65) Prior Publication Data

US 2006/0292758 A1 Dec. 28, 2006

(30) Foreign Application Priority Data

Jun. 28, 2005 (KR) ............ 10-2005-0056197

(51) Int. Cl.
  H01L 35/24 (2006.01)
  H01L 51/00 (2006.01)
  C07D 487/04 (2006.01)
  C07F 5/04 (2006.01)

(52) U.S. Cl. ............ 544/256; 257/40; 549/4; 549/59

(58) Field of Classification Search ............ 544/232, 544/235, 237, 238, 243, 244, 255, 256; 257/40
See application file for complete search history.

(56) References Cited

U.S. PATENT DOCUMENTS

| | | | | |
|---|---|---|---|---|
| 3,074,928 A | * | 1/1963 | Roch et al. | ......... 536/17.4 |
| 6,107,117 A | | 8/2000 | Bao et al. | |
| 6,232,312 B1 | * | 5/2001 | Pamukcu et al. | ......... 514/237.5 |
| 2004/0067387 A1 | * | 4/2004 | Kim et al. | ............ 428/690 |

FOREIGN PATENT DOCUMENTS

| | | | |
|---|---|---|---|
| DE | 1151806 | * | 7/1963 |
| JP | 52059189 | * | 5/1977 |
| JP | 2003261569 | * | 9/2003 |
| WO | WO 00/79617 A1 | | 12/2000 |

OTHER PUBLICATIONS

Curtin, et al., Journal of Medicinal Chemistry (2004), 47(20), 4905-4922.*
Ishikawa, Science of Synthesis (2004), 16, 1337-1397.*
Rodrigues Filho, et al., J. Mass Spectrometry (2003), 38(5), 540-547.*
Castilho, et al., Journal of Electroanalytical Chemistry (2002), 528(1-2), 175-183.*
Northen, et al., Journal of the Chemical Society, Perkin Transactions 1 (2002), (1), 108-115.*
Tonew, et al., Acta Virologica (English Edition) (1978), 22(1), 45-51.*
Deuticke, et al., Arch. Pharmakol. Exptl. Pathol. (1966), 255(1), 107-19.*
Giannini, et al., Bollettino Chimico Farmaceutico (1962), 101(9), 721-7.*
Wikipedia, http://en.wikipedia.org/wiki/Derivative_%28chemistry%29, downloaded May 19, 2008.*
David J. Brennan et al. "Polyfluorenes as Organic Semiconductors for Polymeric Field Effect Transistor", Mat. Res. Soc. Symp. vol. 771, #L6.1.1 © 2003.
Sandrine Martin et al., "Source/ drain contacts in organic polymer thin film transistor", Mat. Res. Soc. Symp. vol. 771, #L6.2.1 © 2003.
Tommie W. Kelley et al., "High Performance Organic Thin Film Transistors", Mat. Res. Soc. Symp. vol. 771, #L6.5.1, © 2003.
Francis Garnier et al., "Molecular Engineering of Organic Semiconductors: Design of Self-Assembly Properties in Conjugated Thiophene Oligomers", J. Am. Chem. Soc. © 1993, vol. 115, pp. 8716-8721.
H. Sirringhaus et al., "High-Resolution Inkjet Printing of All-polymer Transistor Circuits", Science, vol. 290, Dec. 15, 2000, pp. 2123-2126.

* cited by examiner

*Primary Examiner*—Mark L Berch
*Assistant Examiner*—Cecilia M Jaisle
(74) *Attorney, Agent, or Firm*—Harness, Dickey & Pierce P.L.C.

(57) ABSTRACT

Pyrimidopyrimidine derivatives, organic thin film transistors using pyrimidopyrimidine derivatives and method for fabricating the same are provided. Pyrimidopyrimidine derivative structures, along with example syntheses, are provided. The pyrimidopyrimidine derivatives may be pyrimidopyrimidine oligothiophene derivatives in which an oligothiophene having p-type semiconductor characteristics may be bonded to a pyrimidopyrimidine having n-type semiconductor characteristics positioned substantially in the center of the molecules, thereby simultaneously exhibiting both p-type and n-type semiconductor characteristics. The pyrimidopyrimidine derivatives may be spin-coated at room, or ambient, temperature when applied to the fabrication of an electronic device, for example, organic thin film transistors. Organic thin film transistors using the pyrimidopyrimidine derivatives may provide higher charge carrier mobility and/or lower off-state leakage current.

11 Claims, 2 Drawing Sheets

PYRIMIDOPYRIMIDINE DERIVATIVES, ORGANIC THIN FILM TRANSISTORS USING PYRIMIDOPYRIMIDINE DERIVATIVES AND METHOD FOR FABRICATING THE SAME

PRIORITY STATEMENT

This U.S. non-provisional application claims priority under 35 U.S.C. § 119 to Korean Patent Application No. 2005-56197, filed on Jun. 28, 2005, in the Korean Intellectual Property Office (KIPO), the entire contents of which are incorporated herein by reference.

BACKGROUND

1. Field of the Invention

Example embodiments of the present invention relate to pyrimidopyrimidine derivatives, organic thin film transistors using pyrimidopyrimidine derivatives and method of fabricating the same. Various example embodiments of the present invention relate to pyrimidopyrimidine oligothiophene derivatives in which an oligothiophene having p-type semiconductor characteristics may be bonded to a pyrimidopyrimidine having n-type semiconductor characteristics positioned in the center of the molecules, thereby exhibiting both p-type and n-type semiconductor characteristics, and organic thin film transistors using the derivatives as organic semiconductor materials.

2. Description of the Related Art

General organic thin film transistors (OTFTs) may comprise a substrate, a gate electrode, an insulating layer, source-drain electrodes and/or a channel layer. Organic thin film transistors may be classified into bottom-contact (BC) OTFTs wherein a channel layer may be formed on the source-drain electrodes, and top-contact (TC) OTFTs wherein metal source-drain electrodes may be formed on a channel layer by mask deposition.

Inorganic semiconductor materials, for example, silicon (Si), have been commonly used as materials for channel layers of OTFTs. However, with increasing demand for the manufacture of large-area, flexible displays at reduced costs, organic semiconductor materials may be used as materials for channel layers rather than inorganic semiconductor materials.

Some studies focusing on organic semiconductor materials for channel layers of OTFTs have been undertaken. Lower molecular weight materials and oligomers, e.g., melocyanines, phthalocyanines, perylenes, pentacenes, $C_{60}$, thiophene oligomers, and the like are of some interest. Conventional devices may have charge carrier mobilities of approximately 3.2-5.0 cm$^2$/Vs using a pentacene single crystal, or similar structure. Other conventional devices may have a charge carrier mobility of about 0.01-0.1 cm$^2$/Vs and an on/off current ratio ($I_{on}/I_{off}$ ratio) using an oligothiophene derivative.

Conventional devices are largely dependent on vacuum processes for thin film formation; the fabrication of such devices may be costly.

Higher molecular weight-based OTFTs (e.g., charge carrier mobility of 0.01-0.02 cm$^2$/Vs) employing a polythiophene-based material ($F_8T_2$) are known. Methods for fabricating an organic thin film transistor with a charge carrier mobility of 0.01-0.04 cm$^2$/Vs by employing polythiophene $P_3HT$, which is a representative regioregilar polymer, are known.

Regioregular polythiophene $P_3H_5$ may show a charge carrier mobility of approximately 0.01 cm$^2$/Vs but an off-state leakage current (e.g., 10$^{-9}$ A or more), leading to a lower $I_{on}/I_{off}$ ratio of about 400 or less.

SUMMARY OF THE INVENTION

Example embodiments of the present invention provide lower-molecular weight organic semiconductor materials for organic thin film transistors, or similar applications, which may be spin-coated at about room, or ambient, temperature. Example embodiments of the present invention provide organic semiconductor materials that may demonstrate higher charge carrier mobility and/or lower off-state leakage current when applied to the fabrication of electronic devices.

In accordance with an example embodiment, there may be provided pyrimidopyrimidine derivatives. The pyrimidopyrimidine derivatives may have molecular weights of about 300 to about 5,000. The pyrimidopyrimidine derivatives may be synthesized as one of several structures including a pyrimidopyrimidine oligothiophene derivative. The pyrimidopyrimidine oligothiophene derivatives may include an oligothiophene having p-type semiconductor characteristics may be bonded to a pyrimidopyrimidine having n-type semiconductor characteristics positioned in the center of the molecules.

In accordance with another example embodiment, there may be provided organic thin film transistors in which the lower-molecular weight compounds may be used as materials for an organic active layer so that the transistors may be fabricated by spin coating and/or may satisfy the requirements of higher charge carrier mobility and/or lower off-state leakage current. An organic film transistor may comprise a gate electrode, a gate insulating film, source-drain electrodes and/or an organic active layer.

In accordance with another example embodiment of the present invention, a method for fabricating an organic film transistor using pyrimidopyrimidine derivatives is provided. Fabrication of an organic film transistor may include forming a gate electrode, gate insulating film and source-drain electrodes, respectively, on a substrate. The organic film may be formed, or deposited, on the substrate by forming an interlayer on the gate insulating film; and applying the pyrimidopyrimidine derivative onto the interlayer.

BRIEF DESCRIPTION OF THE DRAWINGS

Example embodiments of the present invention will be more clearly understood from the following detailed description taken in conjunction with the accompanying drawings. FIGS. 1-4 represent non-limiting examples embodiments of the present invention as described herein.

DESCRIPTION OF EXAMPLE EMBODIMENTS

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when a compound is referred to as being "connected" or "bonded" to another compound, it can be directly connected or bonded to the other compound or intervening compounds may be present. In contrast, when a compound is referred to as being "directly connected" or "directly bonded" to another compound, there are no intervening compounds present. Other words used to describe the relationship between compounds should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality and/or acts involved.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, for example "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Also, the use of the words "compound," "compounds," or "compound(s)," refer to either a single compound or to a plurality of compounds. These words are used to denote one or more compounds but may also just indicate a single compound.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, for example those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

Example embodiments of the present invention may provide pyrimidopyrimidine derivatives having both n-type and p-type semiconductor characteristics represented by Formulas 1 to 9, shown below:

Formula (1)

Formula (2)

Formula (3)

Formula (4)

Formula (5)

Formula (6)

Formula (7)

Formula (8)

-continued

Formula (9)

wherein $X_1$, $X_2$, $X_3$ and $X_4$ may represent a single bond or —O—, —S—, —$NR_a$—, —$COR_a$—, —$CR_aR_b$—, —$POR_a$— or —$PR_a$— (in which $R_a$ and $R_b$ may represent a hydrogen atom, or $C_{1-30}$ alkyl, $C_{6-30}$ aryl or $C_{2-30}$ heteroaryl group); and $R_1$, $R_2$, $R_3$ and $R_4$ may represent a substituted or unsubstituted $C_{6-30}$ aromatic group, a substituted or unsubstituted $C_{2-30}$ heteroaromatic group and/or a monovalent organic group consisting of a combination thereof. The aromatic and heteroaromatic groups may be substituted with at least one substituent selected from the group consisting of halogen, nitro, amino, cyano, $C_{1-30}$ alkyl, $C_{1-30}$ hydroxyalkyl, $C_{1-30}$ alkoxy, $C_{1-30}$ alkoxyalkyl, $C_{6-30}$ aryl, $C_{6-30}$ arylalkyl, $C_{6-30}$ aryloxy, $C_{2-30}$ heteroaryl, $C_{2-30}$ heteroarylalkyl, $C_{2-30}$ heteroaryloxy, $C_{5-20}$ cycloalkyl, $C_{2-30}$ heterocycloalkyl, $C_{1-30}$ alkyl ester, $C_{1-30}$ heteroalkyl ester, $C_{6-30}$ aryl ester and/or $C_{2-30}$ heteroaryl ester groups.

In an example embodiment, one of the substituents $R_1$, $R_2$, $R_3$ and $R_4$ may include at least two aromatic and/or heteroaromatic groups joined, or bonded, to each other. In another example embodiment, an oligothiophene may include at least two thiophene rings.

In yet another example embodiment, the lower-molecular weight organic semiconductor compounds may have a molecular structure wherein a pyrimidopyrimidine oligothiophene derivative having p-type semiconductor characteristics may be bonded to a pyrimidopyrimidine having n-type semiconductor characteristics positioned in the center of the molecules, forming a pyrimidopyrimidine derivative combination.

Figure 1:
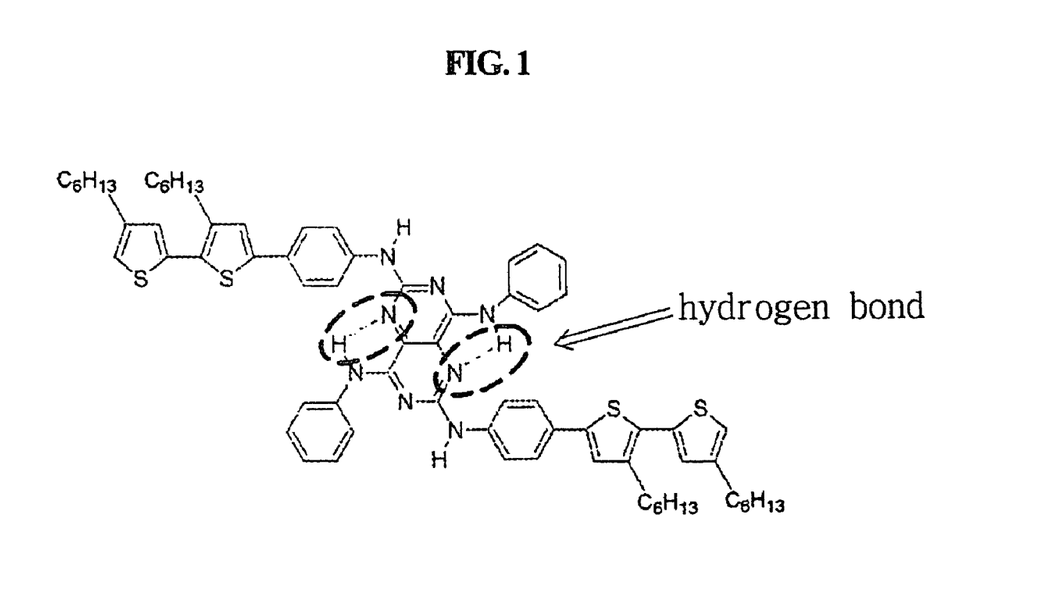
FIG. 1 is a diagram illustrating the presence of hydrogen bonds in a pyrimidopyrimidine oligothiophene derivative according to an example embodiment the present invention.

The organic semiconductor compounds may have a lower molecular weight, and therefore they may have a fairly constant oxidation potential and higher stability when applied to the fabrication of electronic devices. The central moiety of the molecules may be substantially planar due to the hydrogen bonds that may be formed between adjacent molecules or between nitrogen atoms and hydrogen atoms present in one molecule, as shown in FIG. 1. The intramolecular structure of the organic semiconductor compounds may demonstrate improved electrical properties and/or intermolecular stacking. The organic semiconductor compounds may be soluble in the presence of an alkyl, hydroxyalkyl and/or alkoxyalkyl group side chains. Due to their solubility properties, the organic semiconductor compounds may be coated at approximately room, or ambient, temperature by wet processes commonly known in the art.

The aromatic or heteroaromatic organic group present in the pyrimidopyrimidine derivatives may be selected from the group consisting of the compounds of Formula 10, shown below.

Formula (10)

In another example embodiment, the aromatic or heteroaromatic organic group present in the pyrimidopyrimidine derivatives may be a phenyl or thiophene group.

Examples of the pyrimidopyrimidine derivatives of Formula 1 may be compounds represented by Formulas 11 and 12, shown below:

Formula (11)

or

Formula (12)

wherein $R_1$, $R_2$, $R_3$ and $R_4$ may be groups as defined in Formula 1.

Pyrimidopyrimidine oligothiophenes derivatives may be represented by Formulas 13 and 14, shown below:

Formula (13)

Formula (14)

wherein R may be selected from a group consisting of halogen, nitro, amnino, cyano, $C_{1-30}$ alkyl, $C_{1-30}$ hydroxyalkyl, $C_{1-30}$ alkoxy, $C_{1-30}$ alkoxyalkyl, $C_{6-30}$ aryl, $C_{6-30}$ arylalkyl, C6-30 aryloxy, $C_{2-30}$ heteroaryl, $C_{2-30}$ heteroarylalkyl, $C_{2-30}$ heteroaryloxy, $C_{5-20}$ cycloalkyl, $C_{2-30}$ heterocycloalkyl, $C_{1-30}$ alkyl ester, $C_{1-30}$ heteroalkyl ester, $C_{6-30}$ aryl ester and/or $C_{2-30}$ heteroaryl ester groups.

In another example embodiment, pyrimidopyrimidine oligothiophene derivatives may include compounds similar to Formulas 15 and 16, as shown below.

Formula (15)

Formula (16)

The pyrimidopyrimidine oligothiophene derivatives may be synthesized by any methods commonly known in the art. For example, the pyrimidopyrimidine oligothiophene derivatives of Formula 13 may be synthesized by reacting with the pyrimidopyrimidine, prepared in Reaction Scheme 1, with an oligothiophene borolane prepared in Reaction Scheme 2 in the presence of a palladium catalyst according to Reaction Scheme 3, as shown below.

Reaction Scheme (1)

Reaction Scheme (2)

Reaction Scheme (2)

-continued

Reaction Scheme (3)

In Reaction Schemes 2 and 3 above, R may be selected from the group consisting of halogen, nitro, amino, cyano, $C_{1-30}$ alkyl, $C_{1-30}$ hydroxyalkyl, $C_{1-30}$ alkoxy, $C_{1-30}$ alkoxyalkyl, $C_{1-30}$ aryl, $C_{6-30}$ arylalkyl, $C_{6-30}$ aryloxy, $C_{2-30}$ heteroaryl, $C_{2-30}$ heteroarylalkyl, $C_{2-30}$ heteroaryloxy, $C_{5-20}$ cycloalkyl, $C_{2-30}$ heterocycloalkyl, $C_{1-30}$ alkyl ester, $C_{1-30}$ heteroalkyl ester, $C_{6-30}$ aryl ester and/or $C_{2-30}$ heteroaryl ester groups.

The pyrimidopyrimidine oligothiophene derivatives of Formula 1 according to example embodiments the present invention may be synthesized by subjecting the compounds in Reaction Schemes 1 and 2 to a condensation reaction, known as Suzuki coupling. The condensation reaction may be carried out in toluene, N-methylpyrrolidinone, tetrahydrofluran (THF), dimethylformamide (DMF), dioxane, or the like, under a nitrogen atmosphere at approximately 50-180° C. for approximately 2-24 hours.

Further, the pyrimidopyrimidine oligothiophene derivatives may be synthesized in the presence of a palladium catalyst represented by $PdL_4$, $PdL_2$ or $PdL_2X_2$ wherein L may be a ligand selected from the group consisting of triphenylphosphine ($PPh_3$), triphenylarsine ($AsPh_3$), triphenylphosphite ($P(OPh)_3$), diphenylphosphinoferrocene (dppf), diphenylphosphino butane (dppb), acetate (OAc) or dibenzylideneacetone (dba) and X may be I, Br or Cl.

Figure 2:
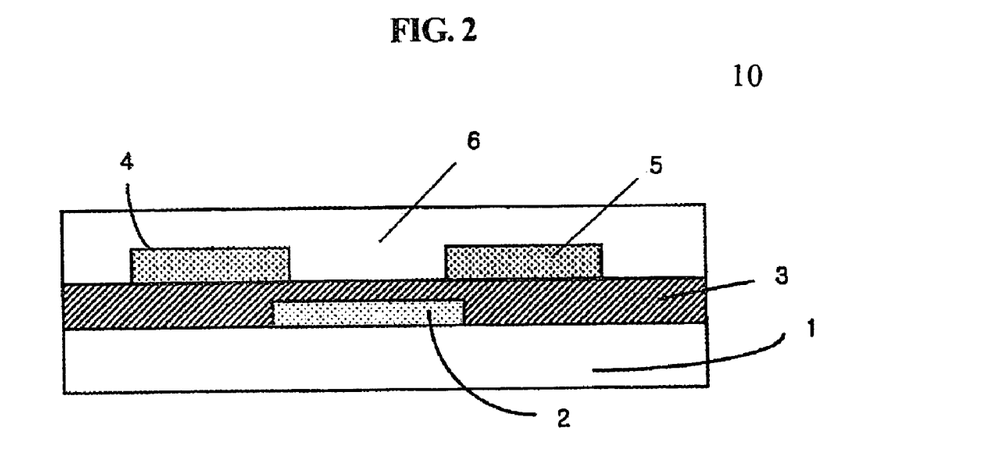
FIG. 2 is a cross-sectional view illustrating the structure of an organic thin film transistor fabricated according to an example embodiment the present invention.

The pyrimidopyrimidine oligothiophene derivatives may be used as organic semiconductor materials for the active layer of the organic thin film transistor 10 shown in FIG. 2.

An example embodiment of the present invention provides a top-contact organic thin film transistor (not shown) having a structure which may include a substrate, a gate electrode, a gate insulating layer, an organic active layer, and/or source-drain electrodes, respectively. Alternatively, referring to FIG. 2, a bottom-contact organic thin film transistor 10 may provided having a structure including a substrate 1, a gate electrode 2, a gate insulating layer 3, source-drain electrodes 4 and 5, and/or an organic active layer 6, respectively. An interlayer may be formed the gate insulating layer and the organic active layer. The interlayer and/or the organic active layer may include the channel layer. It should be appreciated by one of ordinary skill in the art that the organic thin film transistors are not limited to these example structures.

The pyrimidopyrimidine oligothiophene derivatives may be used to form the organic active layer by screen printing, printing, spin coating, dipping, ink-jetting, or any other method appreciated in the art.

In an example embodiment, the substrate 1 may include, but is not limited to, glass, polyethylenenaphthalate (PEN), polyethyleneterephthalate (PET), polycarbonate, polyvinylalcohol, polyacrylate, polyimide, polynorbornene, polyethersulfone (PES) or the like.

The gate electrode 2 may include a metal. For example, the metals may include, but are not limited to, gold (Au), silver (Ag), aluminum (Al), nickel (Ni), chromium (Cr) and/or indium tin oxide (ITO). In alternative embodiments, the gate electrode may be made of any material appreciated in the art.

The gate insulating layer 3 constituting the OTFT may include high-dielectric constant insulators. Insulators may include, but are not limited to, ferroelectric insulators (e.g., $Ba_{0.33}Sr_{0.66}TiO_3$ (BST), $Al_2O_3$, $Ta_2O_5$, $La_2O_5$, $Y_2O_3$ and/or $TiO_2$), inorganic insulators (e.g., $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$ and/or AlON; wherein x is an integer greater than 0) and/or organic insulators (e.g., polyimides, benzocyclobutenes (BCBs), parylenes, polyacrylates, polyvinylalcohols and/or polyvinylphenols).

The source-drain electrodes 4 and 5 may include common metals. The metals may include, but are not limited to, gold (Au), silver (Ag), aluminum (Al), nickel (Ni), chromium (Cr) and/or indium tin oxide (ITO).

Example embodiments of the present invention will now be described in more detail with reference to the following examples. However, these examples are given for the purpose of illustration and are not to be construed as limiting the scope of the invention.

PREPARATIVE EXAMPLE 1

Preparation of Pyrimidopyrimidine 4

A mixture, including 50 mL of aniline added to 2.7 g (10 mmol) of 2,4,6,8-tetrachloropyrimidopyrimidine, may be refluxed for about 25 minutes at approximately 180° C. The reaction solution may be poured into 500 mL of a 2N hydrochloric acid solution. The resulting mixture may be stirred for approximately 30 minutes, followed by extraction with chloroform. The obtained organic layer may be washed with an aqueous sodium bicarbonate solution. The organic layer may be collected, distilled under reduced pressure to remove the solvent and/or dried in an oven, to yield approximately 5 g of Compound 3. Compound 3 may appear as a substantially yellow solid.

The following 1H NMR characteristics of Compound 3 may be obtained in DMSO-$d_6$ (δ ppm): 6.95 (triplet, 2H, J=7.4 Hz), 7.14 (triplet, 2H, J=7.4 Hz), 7.32 (triplet, 4H, J=7.5 Hz), 7.42 (triplet, 4H, J=7.5 Hz) and 8.95 (singlet, 2H), 9.31 (singlet, 2H).

5 mL (10 mmol) of bromine may be slowly added to a solution of 2 g (4.03 mmol) of Compound 3 in chloroform. The mixture may be stirred for approximately one hour. The mixture may be poured into an aqueous sodium bicarbonate solution, and extracted with chloroform. The obtained organic layer may be collected, distilled under reduced pressure to remove the solvent, and/or dried in an oven, to yield approximately 3 g of Compound 4.

The following 1H NMR characteristics of Compound 4 may be obtained in DMSO-$d_6$ (δ ppm): 7.17 (triplet, 2H, J=7.4 Hz), 7.40-7.47 (multiplet, 8H), 7.78 (doublet, 4H, J=8.4 Hz), 7.92 (doublet, 4H, J=8.4 Hz), 9.10 (singlet, 2H), 9.53 (singlet, 1H).

PREPARATIVE EXAMPLE 2

Preparation of Oligothiophene Borolane 2

3-Hexylthiophene may be added to n-BuLi in tetrahydrofuran (THF) at approximately −20° C., and then N,N,N',N'-tetramethylethylenediamine (TMEDA) may be added thereto. The mixture may be heated to around 70° C. for approximately 3 hours. Dioxaborolane may be added to the mixture at −78° C., the reaction mixture may be gradually heated to approximately room temperature to yield thiophene borolane 1.

Thiophene borolane 1 and 2-bromothiophene may be added to a mixture of toluene and water, and then tetrakis(triphenylphosphine)palladium (0) (Pd(PPh$_3$)$_4$, Aldrich) may be added thereto. The reaction mixture may be maintained at about 100° C. for approximately 8 hours to yield Compound 2a.

Compound 2a may be added to n-BuLi in tetrahydrofuran (THF) at approximately −20° C., then TMEDA may be added. The resulting mixture may be heated to about 70° C. for approximately 3 hours. Dioxaborolane may be added to the mixture at about −78° C., the reaction mixture may be slowly heated to approximately room temperature to yield oligothiophene borolane 2.

The following 1H NMR characteristics of oligothiophene borolane 2 may be obtained at 300 MHz in CDCl$_3$ (δ ppm): 0.89 (triplet, 3H, J=6.8 Hz), 1.21-1.35 (multiplet, 18H), 1.59-1.66 (multiplet, 2H), 2.58 (triplet, 2H, J=7.8 Hz), 6.68 (singlet, 1H), 7.00 (singlet, 1H), 7.20 (doublet, 1H, J=3.5 Hz) and 7.47 (doublet, 1H, J=3.5 Hz).

PREPARATIVE EXAMPLE 3

Preparation of Pyrimidopyrimidine 5a 8.7 mL (95 mmol) of aniline may be slowly added dropwise to a solution of 4 g (19 mmol) of 2,4,6,8-tetrachloropyrimidopyrimidine in 50 mL of chloroform in a water bath at about 0° C. The results of the reaction may be verified by thin layer chromatography (TLC). The reaction mixture may be washed with an aqueous ammonium chloride solution and extracted with chloroform. The organic layer may be separated, distilled under reduced pressure to remove the solvent, and dried in an oven to yield approximately 5 g of Compound 5a. Compound 5a may be a substantially pale yellow solid.

The following 1H NMR characteristics of Compound 5a may be obtained in DMSO-d$_6$ at δ ppm: 7.23 (triplet, 2H, J=7.3 Hz), 7.46 (triplet, 4H, J=7.8 Hz), 7.87 (triplet, 4H, J=8.1 Hz) and 8.66 (singlet, 2H).

PREPARATIVE EXAMPLE 4

Preparation of Oligothiophene Borolane 4

Thiophen-2-yl-magnesium bromide may be added to a mixture of tetrahydrofuran (THF) and hexanal to prepare Compound 3a. Zinc iodide and sodium cyanoborohydride may be added to Compound 3a, the mixture may be heated to approximately 85° C. for about 3 hours to prepare Compound 3b. Lithium diisopropylamide (LDA) in tetrahydrofuran (THF) may be added to compound 3b at about −78° C., and then dioxaborolane may be added thereto to prepare thiophene borolane 3. The thiophene borolane 3 and 2-bromobithiophene may be subjected to Suzuki coupling under the same conditions indicated in Preparative Example 2 to prepare Compound 4a. When the temperature of the reaction mixture reaches approximately −78° C., Lithium diisopropylamide (LDA) in tetrahydrofuran (THF) may be added thereto, followed by the addition of dioxaborolane, to yield oligothiophene borolane 4.

The following 1H NMR characteristics of oligothiophene borolane 4 may be obtained at 300 MHz in $CDCl_3$ (δ ppm): 0.89 (triplet, 3H, J=6.8 Hz), 1.25-1.43 (multiplet, 18H), 1.57-1.88 (m, 2H), 2.79 (triplet, 2H, J=7.5 Hz), 6.68 (doublet, 2H, J=3.5 Hz), 6.97-7.00 (multiplet, 2H), 7.05 (doublet, 1H, J=3.5 Hz), 7.21 (doublet, 1H, J=3.5 Hz) and 7.52 (doublet, 1H, J=3.5 Hz).

SYNTHESIS EXAMPLE 1

Synthesis of Pyrimidopyrimidine Oligothiophene Derivative A

Derivative A

0.4 g (0.61 mmol) of the dibromide, prepared in Preparative Example 1, and 0.7 g (1.53 mmol) of borolane 2, prepared in Preparative Example 2, may be added to 30 mL of a 3:1 toluene/tetrahydrofuran solution and 10 mL of potassium carbonate. 0.35 g (0.305 mmol) of tetrakis(triphenylphosphine)palladium (0) (Pd(PPh$_3$)$_4$) may be added to the mixture. The reaction mixture may be heated to about 110° C. for approximately 8 hours. Thereafter, the reaction mixture may be poured into 50 mL of 2N HCl and extracted with chloroform. The organic layer may be washed with water, dried over magnesium sulfate, filtered, distilled under reduced pressure and/or purified by alumina column chromatography (with chloroform), to yield approximately 0.3 g of Derivative A. Derivative A may appear as a substantially yellow solid.

Derivative A may be precipitated in methanol, filtered and/or dried.

The following 1H NMR characteristics of Derivative A may be obtained in CDCl$_3$ (δ ppm): 0.85-0.91 (m, 12H), 1.25-1.40 (m, 16H), 1.61-1.69 (m, 8H), 2.63 (triplet, 4H, J=7.5 Hz), 2.77 (triplet, 4H, J=7.5 Hz), 6.75 (single, 2H), 6.89 (single, 2H), 6.99 (s, 2H), 7.07 (single, 2H), 7.14 (triplet, 2H, J=7.2 Hz), 7.36 (m, 4H), 7.45-7.53 (m, 8H), 7.68 (double, 4H, J=7.7 Hz) and 8.34 (single, 2H).

SYNTHESIS EXAMPLE 2

Synthesis of Pyrimidopyrimidine Oligothiophene Derivative B 0.5 g (1.33 mmol) of dichloride 5a, prepared in Preparative Example 3, and 1.8 g (3.0 mmol) of borolane 2 may be added to 30 mL of a 3:1 toluene/tetrahydrofuran solution and 10 mL of 2N potassium carbonate. 0.31 g (0.27 mmol) of $Pd(PPh_3)_4$ may be added to the mixture. The reaction mixture maybe heated to approximately 110° C. under a nitrogen atmosphere for about 8 hours. The reaction mixture may be poured into 50 mL of 2N HCl and extracted with chloroform. The organic layer may be washed with water, dried over magnesium sulfate, filtered, distilled under reduced pressure and/or purified by silica gel column chromatography (with hexane/chloroform) to yield approximately 0.92 g of a yellow solid. 0.4 g (0.41 mmol) of the yellow solid may be dissolved in chloroform, and 0.15 g (0.84 mmol) of N-bromosuccinimide (NBS) may be added thereto at about 0° C. The reaction mixture may be poured into an aqueous sodium bicarbonate solution and extracted with chloroform. The organic layer may be washed with water, dried over magnesium sulfate, filtered, distilled under reduced pressure and/or purified by silica gel column chromatography to yield about 0.43 g of dibromide 5b. The appearance of dibromide 5b may be a substantially scarlet solid.

The following 1H NMR characteristics of dibromide 5b may be obtained in $CDCl_3$ (δ ppm): 0.83-0.94 (multiplet, 12H), 1.25-1.40 (multiplet, 24H), 1.60-1.88 (multiplet, 8H), 2.60 (triplet, 4H, J=7.5 Hz), 2.76 (broad triplet, 4H, J=7.5 Hz), 6.85 (singlet, 2H), 7.20 (triplet, 2H, J=7.3 Hz), 7.48 (triplet, 4H, J=7.3 Hz), 7.78 (singlet, 2H), 7.99 (doublet, 4H, J=7.7 Hz) and 8.80 (singlet, 2H).

0.43 g (0.38 mmol) of dibromide 5b and 0.34 g (1.14 mmol) of borolane 1 maybe added to 30 mL of a 3:1 toluene/tetrahydrofuran solution and 10 mL of 2N potassium carbonate. To the resulting mixture, 0.22 g (0.19 mmol) of $Pd(PPh_3)_4$ may be added. The reaction mixture may be heated to about 110° C. under a nitrogen atmosphere for approximately 8 hours. The reaction mixture may be poured into 50 mL of 2N HCl and extracted with chloroform. The organic layer may be washed with water, dried over magnesium sulfate, filtered, distilled under reduced pressure and/or purified by silica gel column chromatography (hexane/chloroform) to yield approximately 0.44 g of a viscous scarlet solid. 0.44 g (0.34 mmol) of the scarlet solid may be dissolved in chloroform, and 0.12 g (0.69 mmol) of N-bromosuccinimide (NBS) may be added thereto at about 0° C. The reaction mixture may be poured into an aqueous sodium bicarbonate solution and extracted with chloroform. The organic layer may be washed with water, dried over magnesium sulfate, filtered, distilled under reduced pressure and/or purified by silica gel column chromatography to yield approximately 0.47 g of Compound 5c. Compound 5c may appear as a red solid.

The following 1H NMR characteristics of Compound 5c may be obtained in CDCl$_3$ (δ ppm): 0.87-0.94 (multiplet, 18H), 1.25-1.45 (multiplet, 36H), 1.60-1.75 (multiplet, 12H), 2.58 (triplet, 4H, J=7.4 Hz), 2.71-2.83 (multiplet, 8H), 6.85 (s, 2H), 7.04 (singlet, 2H), 7.19 (triplet, 2H, J=7.4 Hz), 7.47 (triplet, 4H, J=7.4 Hz), 7.77 (singlet, 2H), 7.80 (doublet, 4H, J=7.4 Hz), 8.78 (singlet, 2H).

0.47 g (0.31 mmol) of Compound 5c and 0.36 g (0.78 mmol) of borolane 4 may be added to 30 mL of a 3:1 toluene/tetrahydrofuran solution and 10 mL of 2N potassium carbonate. 0.22 g (0.19 mmol) of Pd(PPh$_3$)$_4$ may be added to the resulting mixture. The reaction mixture may be heated to about 110° C. under a nitrogen atmosphere for approximately 8 hours. The reaction mixture may be poured into 50 mL of 2N HCl and extracted with chloroform. The organic layer may be washed with water, dried over magnesium sulfate, filtered, distilled under reduced pressure and/or purified by silica gel column chromatography (hexane/chloroform) to yield about 0.43 g of Derivative B. Derivative B may appear as a substantially red solid.

The following 1H NMR characteristics of Derivative B may be obtained in CDCl3 (δ ppm): 0.90-0.94 (multiplet, 24H), 1.26-1.55 (multiplet, 48H), 1.62-1.70 (multiplet, 16H), 2.74-2.82 (multiplet, 16H), 6.70 (singlet, 2H), 6.98-7.11 (multiplet, 14H), 7.19 (triplet, 2H, J=7.4 Hz), 7.50 (triplet, 4H, J=7.4 Hz), 7.79 (singlet, 2H), 8.03 (doublet, 4H, J=7.4 Hz) and 8.82 (broad singlet, 2H).

FABRICATION EXAMPLE 1

Fabrication of Organic Thin Film Transistor Using Pyrimidopyrimidine Oligothiophene Derivative A Chromium may be deposited to a thickness of 1,000 Å on a clean plastic substrate by a sputtering process, or any other appreciated method, to form a gate electrode 2. Thereafter, SiO$_2$ may be deposited to a thickness of 1,000 Å on the gate electrode 2 by a chemical vapor deposition (CVD) process to form a gate insulating film 3. Indium tin oxide (ITO) may be deposited to a thickness of 1,200 Å on the gate insulating film 3 by sputtering to form source-drain electrodes 4 and 5. The resulting substrate may be washed with isopropyl alcohol for about 10 minutes and dried before subsequent deposition of an organic semiconductor material on the gate insulating film. The dried structure may be coated, or dipped, in a 10 mM octadecyltrichlorosilane solution in hexane for approximately 30 seconds, washed with acetone and/or dried. Separately, pyrimidopyrimidine-oligothiophene derivative A, synthesized in Synthesis Example 1, may be dissolved in toluene to obtain a 1.0 wt % solution. The solution may be spin-coated at approximately 1,000 rpm to a thickness of around 700 Å on the dried structure, and baked under an argon atmosphere at approximately 100° C. for about one hour to fabricate the bottom-contact OTFT transistor as shown in FIG. 2.

FABRICATION EXAMPLE 2

Fabrication of Organic Thin Film Transistor Using Pyrimidopyrimidine Oligothiophene Derivative B An organic thin film transistor may be fabricated in the same manner as in Example 1, except that pyrimidopyrimidine oligothiophene Derivative B, synthesized in Synthesis Example 2, may be used as a material for the organic active layer.

Figure 3:
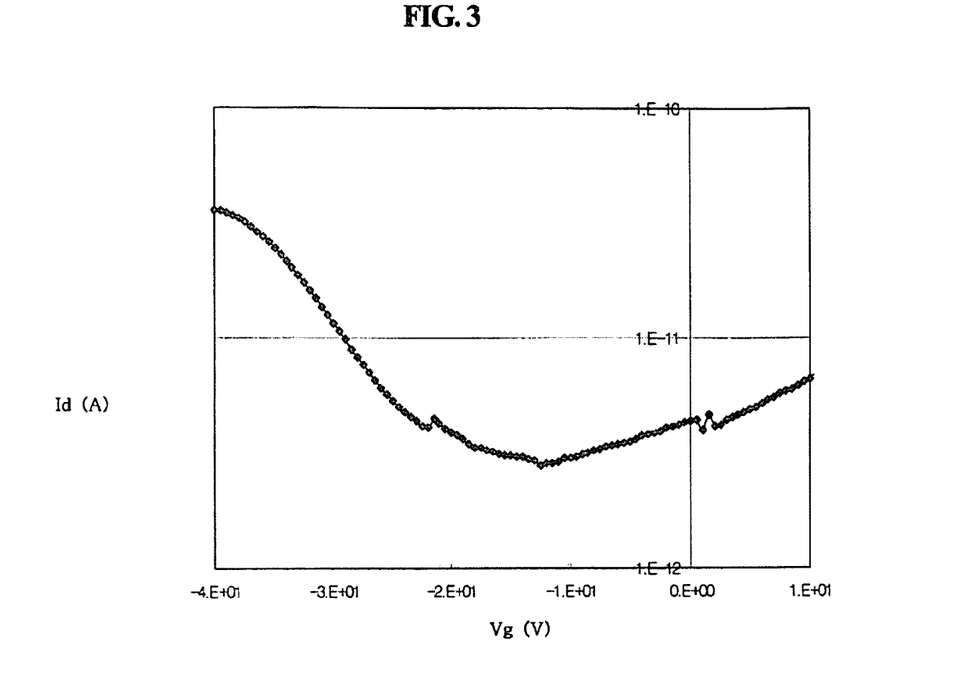
FIG. 3 is a graph illustrating the current transfer characteristics of an organic thin film transistor according to an example embodiment the present invention.
Figure 4:
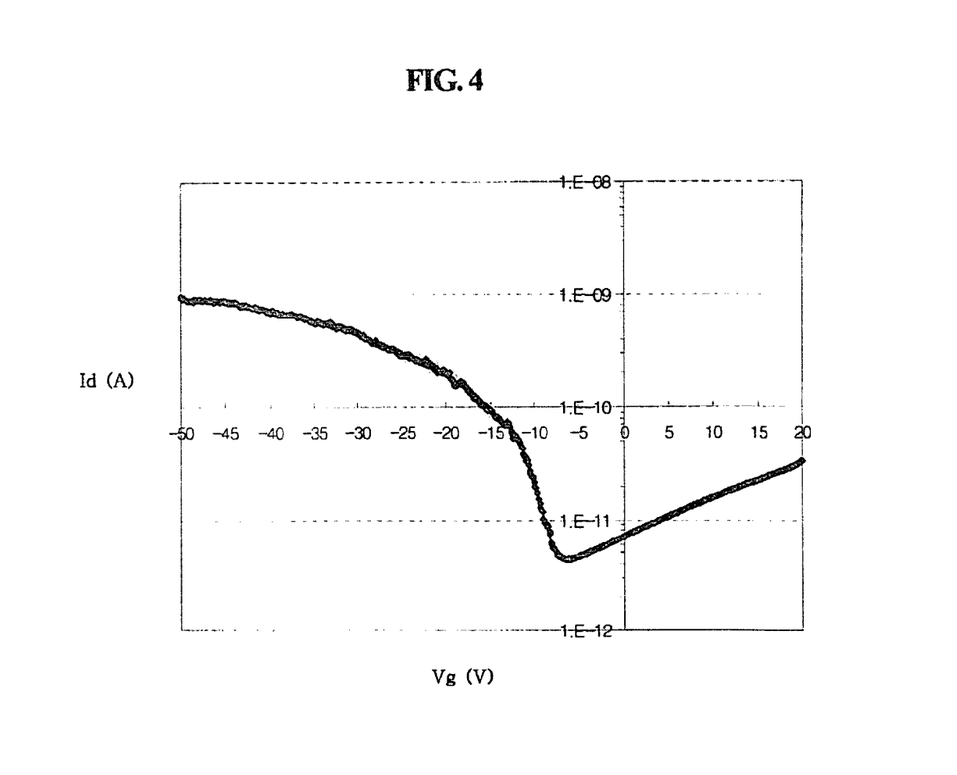
FIG. 4 is a graph illustrating the current transfer characteristics of an organic thin film transistor according to an example embodiment the present invention.

The current transfer characteristics of the devices fabricated in Examples 1 and 2 may be measured using a semiconductor characterization system (e.g., 4200-SCS, KEITHLEY), and their curves may be plotted, as shown in FIGS. 3 and 4. The electrical properties of the devices may be measured in accordance with the following methods, and results similar to those results shown in Table 1 (below) may be obtained.

The charge carrier mobility may be calculated from the slope of a graph representing the relationship between $I_{SD}/2$ and $V_G$ from the following current equations in the saturation region using the current transfer curves:

$$I_{SD} = \frac{WC_0}{2L}\mu(V_G - V_T)^2 \quad \text{Equation (1)}$$

$$\sqrt{I_{SD}} = \sqrt{\frac{\mu C_0 W}{2L}}(V_G - V_T) \quad \text{Equation (2)}$$

$$\text{slope} = \sqrt{\frac{\mu C_0 W}{2L}} \quad \text{Equation (3)}$$

$$\mu_{FET} = (\text{slope})^2 \frac{2L}{C_0 W} \quad \text{Equation (4)}$$

wherein $I_{SD}$ is the source-drain current, $\mu$ and $\mu_{FET}$ are the charge carrier mobilities, $C_0$ is the capacitance of the oxide film, W is the channel width, L is the channel length, $V_G$ is the gate voltage and $V_T$ is the threshold voltage.

The off-state leakage current $I_{off}$ may be a current flowing in the off-state, and may be determined from the minimum current in the off-state.

TABLE 1

| Organic active layer | Charge carrier mobility (cm$^2$/Vs) | Off-state leakage current (A) |
|---|---|---|
| Example 1 | 5 × 10$^{-6}$ | 1 × 10$^{-12}$ |
| Example 2 | 1 × 10$^{-3}$ | 5 × 10$^{-12}$ |

As can be seen from the data shown in Table 1, the pyrimidopyrimidine derivatives may demonstrate higher charge carrier mobility, and an off-state leakage current of approximately 1×10$^{-12}$ to 10$^{-11}$ A. The pyrimidopyrimidine oligothiophene derivatives, according to example embodiments of the present invention may have increased performance in the fabrication of OTFTs.

The present invention has been described herein with reference to example embodiments, but these embodiments do not serve to limit the invention. Those skilled in the art will appreciate that various modifications are possible, without departing from the scope and spirit of the invention as disclosed in the accompanying claims.

As apparent from the foregoing, the pyrimidopyrimidine derivatives of the present invention may be lower-molecular weight organic semiconductor materials with a novel structure. In addition, the pyrimidopyrimidine derivatives of the present invention may be spin-coated at approximately room temperature by wet processes, and may remain substantially stable. Furthermore, when the pyrimidopyrimidine derivatives, according to example embodiments of the present invention, are used as materials for an active layer of organic thin film transistors, higher charge carrier mobility and lower off-state leakage current may be achieved.

What is claimed is:

1. A pyrimidopyrimidine compound represented by one of Formulas 17 and 18 below:

(17)

-continued

(18)

wherein $R_1$ to $R_{10}$ are independently a hydrogen atom, $C_{1-30}$ alkyl, phenyl group, or thienyl group;

$Ar_1$ to $Ar_4$ are independently a substituted or unsubstituted phenyl group or a substituted or unsubstituted thienyl group, a substituent of the substituted phenyl group or substituted thienyl group being a $C_{1-30}$ alkyl group; and $n_1$ to $n_6$ are natural numbers from 1 to 5.

2. The pyrimidopyrimidine compound according to claim 1, wherein the pyrimidopyrimidine compound is a pyrimidopyrimidine oligothiophene represented by Formula 13 or 14 below:

(13)

wherein R is selected from a group consisting of a hydrogen atom, $C_{1-30}$ alkyl, phenyl group, or thienyl group, and

(14)

wherein R is as defined in Formula 13.

3. The pyrimidopyrimidine compound according to claim 2, wherein the pyrimidopyrimidine compound is a pyrimidopyrimidine oligothiophene represented by Formula 15 or 16 below:

(15)

(16)

-continued

4. An organic thin film transistor comprising a gate electrode, a gate insulating film, source-drain electrodes, and an organic active layer sequentially formed on a substrate, wherein the organic active layer is formed of the pyrimidopyrimidine compound according to claim 1.

5. The organic thin film transistor according to claim 4, wherein the organic active layer is formed by screen printing, printing, spin coating, dipping or ink-jetting.

6. The organic thin film transistor according to claim 4, wherein the gate insulating film is made of a ferroelectric insulator, an inorganic insulator or an organic insulator.

7. The organic thin film transistor according to claim 6, wherein the ferroelectric insulator is selected from a group consisting of $Ba_{0.33}Sr_{0.66}TiO_3$ (BST), $Al_2O_3$, $Ta_2O_5$, $La_2O_5$, $Y_2O_3$, or $TiO_2$;

the inorganic insulator is selected from a group consisting of $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$ or AlON, x is an integer greater than 0; and the organic insulator is selected from a group consisting of polyimides, benzocyclobutenes (BCBs), parylenes, polyacrylates, polyvinylalcohols or polyvinylphenols.

8. The organic thin film transistor according to claim 4, wherein the substrate is made of a material selected from a group consisting of glass, polyethylenenaphthalate (PEN), polyethyleneterephthalate (PET), polycarbonate, polyvinylalcohol, polyacrylate, polyimide, polynorbornene or polyethersulfone (PES).

9. The organic thin film transistor according to claim 4, wherein the gate electrode is made of a material selected from a group consisting of gold (Au), silver (Ag), aluminum (Al), nickel (Ni), chromium (Cr) or indium tin oxide (ITO).

10. The organic thin film transistor according to claim 4, wherein the source-drain electrodes are made of a material selected from a group consisting of gold (Au), silver (Ag), aluminum (Al), nickel (Ni), chromium (Cr) or indium tin oxide (ITO).

11. A method for fabricating an organic film transistor, comprising:

sequentially forming a gate electrode, gate insulating film, source-drain electrodes, and an organic active layer on a substrate, the organic active layer formed using the pyrimidopyrimidine compound according to claim 1.

* * * * *